United States Patent
Park et al.

(10) Patent No.: US 11,763,903 B2
(45) Date of Patent: Sep. 19, 2023

(54) NONVOLATILE MEMORY DEVICE INCLUDING ARTIFICIAL NEURAL NETWORK, MEMORY SYSTEM INCLUDING SAME, AND OPERATING METHOD OF NONVOLATILE MEMORY DEVICE INCLUDING ARTIFICIAL NEURAL NETWORK

(71) Applicant: SAMSUNG ELECTRONICS CO., LTD., Suwon-si (KR)

(72) Inventors: Sehwan Park, Yongin-si (KR); Jinyoung Kim, Seoul (KR); Youngdeok Seo, Seoul (KR); Dongmin Shin, Seoul (KR)

(73) Assignee: Samsung Electronics Co., Ltd.

( * ) Notice: Subject to any disclaimer, the term of this patent is extended or adjusted under 35 U.S.C. 154(b) by 25 days.

(21) Appl. No.: 17/498,832

(22) Filed: Oct. 12, 2021

(65) Prior Publication Data
US 2022/0230695 A1 Jul. 21, 2022

(30) Foreign Application Priority Data
Jan. 21, 2021 (KR) .................. 10-2021-0008917

(51) Int. Cl.
| | | |
|---|---|---|
| G11C 16/34 | (2006.01) | |
| G11C 7/10 | (2006.01) | |
| G11C 11/54 | (2006.01) | |
| G11C 16/04 | (2006.01) | |
| G11C 16/10 | (2006.01) | |
| G11C 16/14 | (2006.01) | |
| G11C 16/26 | (2006.01) | |

(52) U.S. Cl.
CPC ........ *G11C 16/3459* (2013.01); *G11C 7/1057* (2013.01); *G11C 7/1084* (2013.01); *G11C 11/54* (2013.01); *G11C 16/0433* (2013.01); *G11C 16/102* (2013.01); *G11C 16/14* (2013.01); *G11C 16/26* (2013.01); *G11C 16/3445* (2013.01); *G11C 16/3495* (2013.01)

(58) Field of Classification Search
CPC . G11C 16/3459; G11C 7/1057; G11C 7/1084; G11C 11/54; G11C 16/0433; G11C 16/102; G11C 16/14; G11C 16/26; G11C 16/3445; G11C 16/3495
See application file for complete search history.

(56) References Cited

U.S. PATENT DOCUMENTS 8,072,805 B2 * 12/2011 Chou .................. G11C 11/5642
                                                              365/185.09
10,013,211 B2    7/2018 Lee et al.
(Continued)

OTHER PUBLICATIONS

Communication From the European Patent Office Cited in EP Patent Application No. 21212645.2, dated Jun. 2, 2022.

*Primary Examiner* — Vanthu T Nguyen
(74) *Attorney, Agent, or Firm* — Fish & Richardson P.C.

(57) ABSTRACT

A nonvolatile memory device includes; a memory cell array including a meta data region storing chip-level information, control logic identifying a target cell in response to a command, machine learning (ML) logic inferring an optimum parameter based on the chip-level information and physical information associated with the target cell applied as inputs to an artificial neural network model, and a buffer memory configured to store weight parameters of the artificial neural network model.

19 Claims, 11 Drawing Sheets

(56) References Cited

U.S. PATENT DOCUMENTS

| | | | |
|---|---|---|---|
| 10,289,341 B2* | 5/2019 | Kirshenbaum | ....... G06F 3/0616 |
| 10,552,251 B2 | 2/2020 | Qin et al. | |
| 10,573,389 B2 | 2/2020 | Kim et al. | |
| 10,573,390 B1 | 2/2020 | Berman | |
| 10,672,479 B2 | 6/2020 | Kim et al. | |
| 10,811,075 B1 | 10/2020 | Cheng et al. | |
| 11,049,776 B2* | 6/2021 | Jung | ....................... H01L 22/32 |
| 2019/0057302 A1 | 2/2019 | Cho et al. | |
| 2019/0347573 A1 | 11/2019 | Shih | |
| 2019/0363131 A1 | 11/2019 | Torng et al. | |
| 2020/0151539 A1 | 5/2020 | Oh et al. | |
| 2020/0168271 A1 | 5/2020 | Vasyltsov et al. | |
| 2020/0193277 A1 | 6/2020 | Kwon | |
| 2020/0210831 A1 | 7/2020 | Zhang et al. | |
| 2020/0381065 A1 | 12/2020 | Joe et al. | |
| 2020/0381068 A1 | 12/2020 | Yu et al. | |
| 2020/0402591 A1 | 12/2020 | Xiong et al. | |

* cited by examiner

NONVOLATILE MEMORY DEVICE INCLUDING ARTIFICIAL NEURAL NETWORK, MEMORY SYSTEM INCLUDING SAME, AND OPERATING METHOD OF NONVOLATILE MEMORY DEVICE INCLUDING ARTIFICIAL NEURAL NETWORK

CROSS-REFERENCE TO RELATED APPLICATION

This application claims priority under 35 U.S.C. § 119 to Korean Patent Application No. 10-2021-0008917 filed on Jan. 21, 2021 in the Korean Intellectual Property Office, the subject matter of which is hereby incorporated by reference.

BACKGROUND

The inventive concept relates generally to memory devices, and more particularly, to nonvolatile memory devices, memory systems including nonvolatile memory device(s), and operating methods for nonvolatile memory devices.

Contemporary and emerging memory devices must high data storage capacity with ever-more dense integration in order to meet consumer demands for expanded functionality and lower costs. The so-called "vertical NAND" (or "V-NAND") type flash memory device is one response to demands for higher data storage capacity and increased integration density. A chip-to-chip (C2C) structure for the V-NAND structure may be provided, wherein memory cell circuitry and peripheral circuitry are separately manufactured on different wafers and then later connected. This approach stands in contrast with approaches used to manufacture cell over periphery (COP) structures, wherein both the memory cell circuitry and the peripheral circuitry are manufactured on a single wafer.

Unfortunately, as the number of word lines vertically stacked in a V-NAND increases, the size of a corresponding channel hole for each word line may vary. This outcome together with other factors may result in a range of output voltages, even when a constant voltage is applied to the respective word lines.

SUMMARY

Embodiments of the inventive concept provide nonvolatile memory devices incorporating an artificial neural network model configured to infer an optimum voltage for a word line. Embodiments of the inventive concept also provide operating methods for nonvolatile memory devices having this feature, as well as memory systems including such nonvolatile memory device(s).

According to an aspect of the inventive concept, there is provided a nonvolatile memory device including; a memory cell array including a meta data region storing chip-level information, control logic configured to receive a command and identify a target cell indicated by the command, machine learning (ML) logic configured to infer an optimum parameter based on the chip-level information and physical information associated with the target cell applied as inputs to an artificial neural network model, and a buffer memory configured to store weight parameters of the artificial neural network model.

According to an aspect of the inventive concept, there is provided an operating method of a nonvolatile memory device, wherein the nonvolatile memory device includes a memory cell array implemented in a first chip manufactured on a first wafer and including a meta region storing chip-level information, and a peripheral region implemented on a second chip manufactured on a second wafer different from the first wafer and including a buffer memory and machine learning (ML) logic, wherein the first chip and the second chip are bonded using a chip-to-chip (C2C) bonding method. The operating method includes; identifying a target cell in the memory cell array in response to received command, loading the chip-level information from the memory cell array to the buffer memory, loading physical information associated with the target cell to the buffer memory, and inferring an optimum parameter, using the ML logic, based on the chip-level information and the physical information applied as inputs to an artificial neural network model.

According to an aspect of the inventive concept, there is provided a memory system including; a host device configured to communicate a command, and a nonvolatile memory device. The nonvolatile memory device includes; a memory cell array including a meta data region storing chip-level information, control logic configured to receive the command and identify a target cell in response to the command, machine learning (ML) logic configured to infer an optimum parameter based on the chip-level information and physical information associated with the target cell applied as inputs to an artificial neural network model, and a buffer memory configured to store weight parameters of the artificial neural network model, wherein the ML logic is further configured to perform a training operation on the artificial neural network model.

BRIEF DESCRIPTION OF THE DRAWINGS

Embodiments of the inventive concept may be more clearly understood upon consideration of the following detailed description together with the accompanying drawings in which.

DETAILED DESCRIPTION

Throughout the written description and drawings, like reference numbers and labels are used to denote like or similar elements and/or features.

Figure 1:
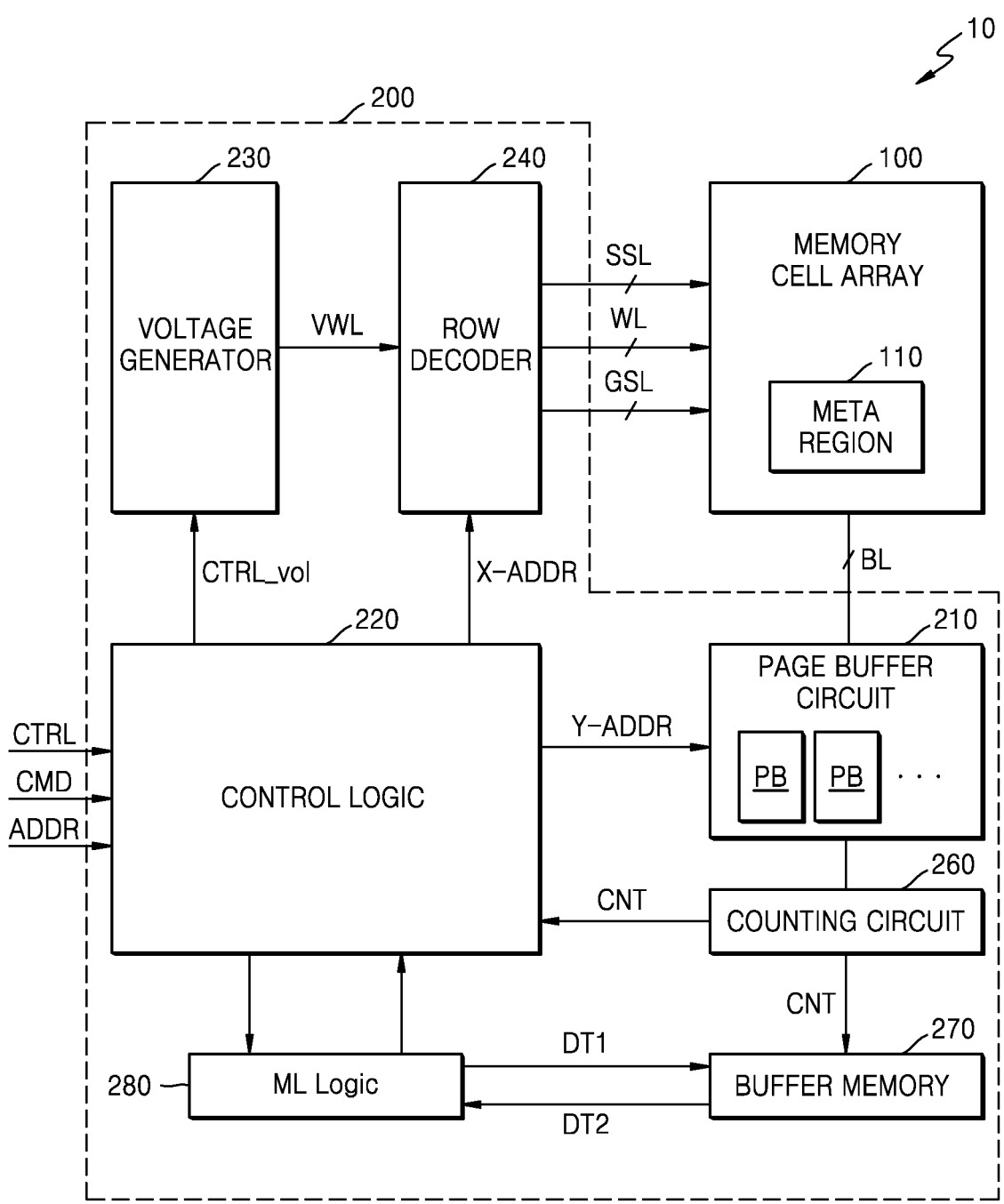
FIG. 1 is a block diagram illustrating a nonvolatile memory device 10 according to embodiments of the inventive concept.

Figure (FIG. 1 is a block diagram illustrating a nonvolatile memory device 10 according to embodiments of the inventive concept.

Referring to FIG. 1, the nonvolatile memory device 10 may generally include a memory cell array 100 and a peripheral circuit 200. Here, the peripheral circuit 200 may include a page buffer circuit 210, a control logic 220, a voltage generator 230, a row decoder 240, a counting circuit 260, a buffer memory 270, and a machine learning (ML) logic 280. Here, the ML logic 280 may be variously implemented in hardware, firmware and/or software and may be broadly referred as a "machine learning (ML) inference processor." Although not specifically illustrated in FIG. 1, the peripheral circuit 200 may further include various data input and output (I/O) circuit(s), as well as various I/O interface(s).

In some embodiments, the memory cell array 100 may be connected to the page buffer circuit 210 through bit lines BL and to the row decoder 240 through word lines WL, string selection lines SSL, and/or ground selection lines GSL. The memory cell array 100 may include memory cells of one or more types (e.g., flash memory cells). Hereinafter, embodiments of the inventive concept will be described in the context of (or under the assumption that) the memory cells of the memory cell array 100 are NAND flash memory cells. However, the scope of the inventive concept is not limited thereto, and the memory cells of the memory cell array 100 may additionally or alternately include resistive memory cells (e.g., resistive random-access memory (ReRAM) memory cells), phase change random-access memory (PRAM) memory cells, and/or magnetic random-access memory (MRAM) memory cells.

In some embodiments, the memory cell array 100 may include a three-dimensional (3D) memory cell array including NAND strings including memory cells respectively connected to word lines vertically stacked on a substrate. In this regard, the collective subject matter of U.S. Pat. Nos. 7,679,133; 8,553,466; 8,654,587; and 8,559,235, as well as published U.S. Patent Application No. 2011/0233648 is hereby incorporated by reference. These documents disclose several configurations in which a 3D memory array is formed at multiple levels sharing word lines and/or bit lines. However, in some embodiments, the memory cell array 100 may include a two-dimensional (2D) memory cell array.

In some embodiments, the memory cell array 100 may further include a meta region 110 corresponding to at least a region of the memory cell array 100. The meta region 110 may be used to store certain data describing chip level information, such as wafer location information, wafer reliability information, program/erase (P/E) cycle information, etc.

In this regard, "wafer location information" may include information indicating a chip location on a wafer at which the nonvolatile memory device 10 is realized. Wafer location information is valuable because certain variable processing outcomes may result in different chips at different locations on a wafer exhibiting different performance characteristics. For example, a chip located at a first location on a wafer (e.g., an edge portion of the wafer) may exhibit a high deterioration speed or an increased error probability when compared with a chip located at a second location on the wafer (e.g. a central portion of the wafer). Accordingly, the meta region 110 of the memory cell array 100 may include the wafer location information—which may be wholly or selectively communicated with (e.g., transmitted to and/or received from) the ML logic 280.

"Wafer reliability information" may include various processing reliability information associated with the wafer on which a chip including the nonvolatile memory device 10 is realized. For example, even when wafers are manufactured by the same manufacturer, certain quality characteristics for the wafers may be various from one wafer to another wafer. Hence, chips manufactured on a first wafer having relatively high quality may have a lesser deterioration speed than chips manufactured on a second wafer having a relatively low quality. Accordingly, the meta region 110 of the memory cell array 100 may include the wafer reliability information (e.g., quality information for different wafer(s))—which may be wholly or selectively communicated with the ML logic 280.

"P/E cycle information" indicates a number of P/E cycles that have previously been performed with respect to respective memory cells (or respective groups of memory cells) in the memory cell array 10. In this regard, P/E cycle information may be understood as describing the durability of the memory cell array 100.

In some embodiments, the control logic 220 may be used to provide various control signals that control the programming of data in the memory cell array 100, the reading of data from the memory cell array 100, and/or the erasing of data stored in the memory cell array 100. Such control signals may be variously defined, but usually include command(s) CMD, address(es) ADDR, and/or control signal(s) CTRL. Exemplary control signals may include a voltage control signal CTRL_vol, a row address X-ADDR, and a column address Y-ADDR. In this manner, the control logic 220 may generally control the execution of various operations by the nonvolatile memory device 10.

In some embodiments, the voltage generator 230 may generate voltage(s) selectively applied to the memory cell array 100 during program, read, and/or erase operations in response to (e.g.,) the voltage control signal CTRL_vol. That is, the voltage generator 230 may generate a word line voltage VWL (e.g., a program voltage, a read voltage, a pass voltage, an erase verify voltage, or a program verify voltage). The voltage generator 230 may also generate a string selection line voltage and/or a ground selection line voltage.

In some embodiments, the row decoder 240 may select one or more memory blocks from among a plurality of memory blocks in the memory cell array 100. The row decoder 240 may also one or more words lines WL and/or one or more string selection lines SSL in response to (e.g.,) the row address X-ADDR.

In some embodiments, the page buffer circuit 210 may select one or more bit lines BL in response to (e.g.,) the column address Y-ADDR. In this regard, the page buffer circuit 210 may operate as a write driver during program (or write) operations or as a sense amplifier during read operations. Here, in some embodiments, the page buffer circuit 210 may include a plurality of page buffers PB respectively connected to the bit lines BL. As a result, the page buffers PB may be arranged as a matrix including columns and rows. In some embodiments, the page buffers PB may be variously arranged in multi-stage structures.

In some embodiments, the counting circuit 260 may be used to count a number of memory cells (a "counted value")

as the result of a sensing operation performed by the page buffers PB. Based on the counted value, the counting circuit 260 may additionally count a number of ON-cells and/or a number of OFF-cells when a verify voltage is applied to the memory cell array 100. The counting circuit 260 may provide certain counted value(s) to the control logic 220 and/or the buffer memory 270.

In some embodiments, the ML logic 280 may be used to derive (or "infer") an "optimum parameter", e.g., a word line voltage associated with a target memory cell using an artificial neural network model. In this regard, the operation of the ML logic 280 may be based not only on the artificial neural network model, but also on various ML models including at least one of a decision tree, a linear regression model, a support vector machine, etc.

In some embodiments, the artificial neural network model may include one or more models, such as a convolution neural network (CNN) (e.g., GoogleNet, AlexNet, VGG Network, etc.). The artificial neural network model may alternately or additionally include a region with a CNN (R-CNN), a region proposal network (RPN), a recurrent neural network (RNN), a stacking-based deep neural network (S-DNN), a state-space dynamic neural network (S-SDNN), a deconvolution network, a deep belief network (DBN), a restricted Boltzmann machine (RBM), a fully convolutional network, a long short-term memory (LSTM) network, a classification network, etc. However, the artificial neural network model is not limited to only the foregoing examples.

In some embodiments, the buffer memory 270 may be used to load the artificial neural network model to the ML logic 280. The buffer memory 270 may also be used to store a parameter, an intermediate output, a result value, etc., derived during a "inferring process" performed by the artificial neural network. Here, the ML logic 280 may include additional IP blocks configured to process the large number of calculations usually associated with the operation of a artificial neural network model. For example, the additional IP blocks may include a graphical processing unit (GPU) or an accelerator configured to quickly performing one or more calculations.

Figure 2:
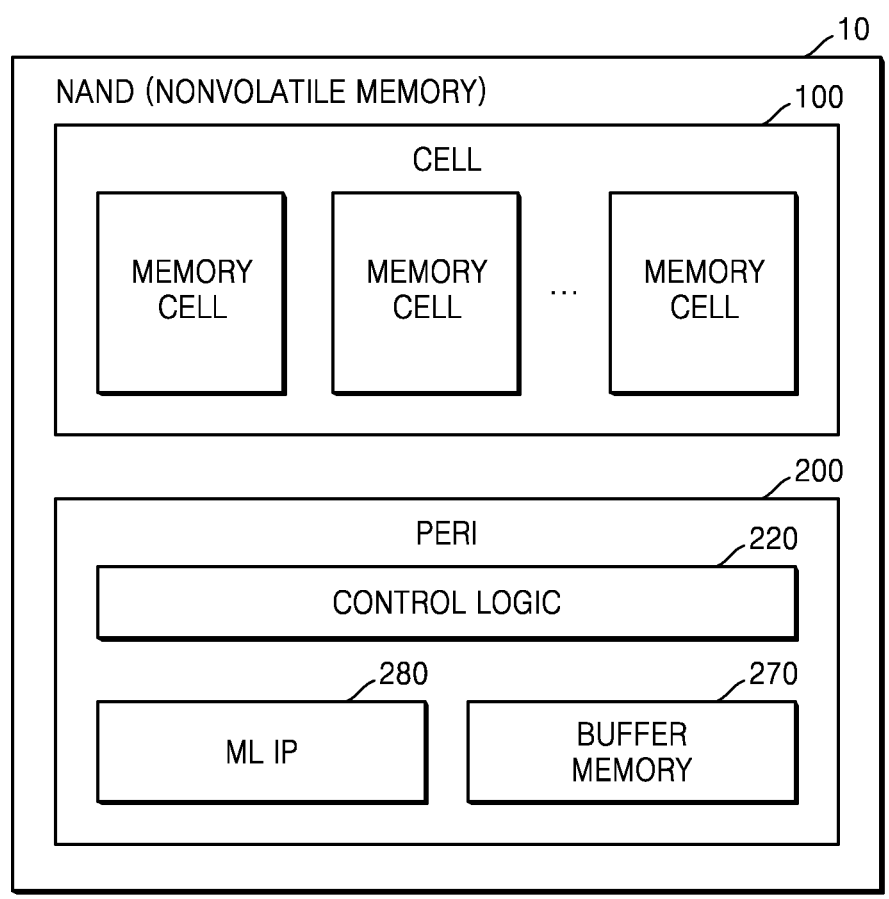
FIG. 2 is a block diagram further illustrating the nonvolatile memory device 10 of FIG. 1.

FIG. 2 is a block diagram further illustrating the nonvolatile memory device 10 of FIG. 1.

Here, it is assumed that the nonvolatile memory device 10 is manufactured with a C2C structure (e.g., a structure in which an upper chip including a cell region CELL is manufactured on a first wafer, and a lower chip including a peripheral circuit region PERI is manufactured on a second wafer, wherein the upper chip and the lower chip are afterward connected to one another using a bonding method). In this regard, the cell region CELL may correspond to the memory cell array 100 of FIG. 1, and the peripheral circuit region PERI may correspond to the peripheral circuit 200 of FIG. 1. Those skilled in the art will appreciate that one of various well-understood bonding methods may be used to electrically connect a bonding metal layer formed on an uppermost metal layer of the upper chip with a bonding metal formed on an uppermost metal layer of the lower chip, for example. In this regard, when the bonding metals may include Cu in certain Cu—Cu bonding methods. However, the bonding metals may also include Al or W.

Inherent in the use of a C2C structure is the possibility that the first wafer and the second wafer may be different wafers, and/or the possibility that the upper chip and the lower chip have been manufactured using different processing conditions. For example, relatively more sophisticated processing operations may be used during the manufacturing of the peripheral circuit region PERI, as compared with the cell region CELL. In some embodiment, the control logic 220 may be used to perform most calculations. However, when a logic process using the ML logic 280 and the buffer memory 270 in the peripheral circuit region PERI is available, a memory may directly perform the complex calculations required to control the nonvolatile memory device 10, without intervention by a memory controller and without the corresponding signal exchanges with the memory controller. This approach results in improved overall performance, such as reduction in delay times associated with computational operations, etc.

Figure 3:
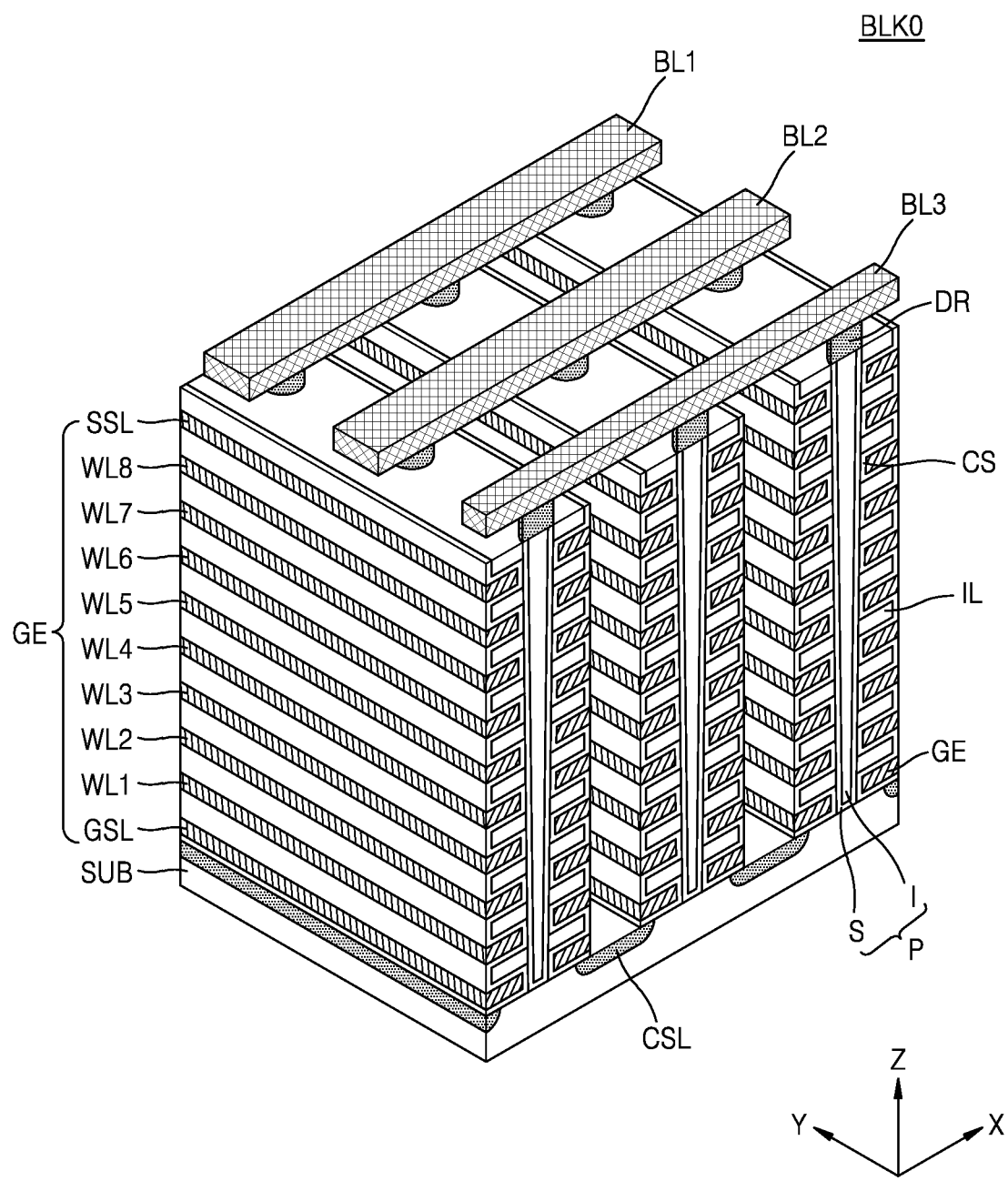
FIG. 3 is a perspective view illustrating a memory block BLK0 that may be incorporated within the nonvolatile memory device 10 of FIG. 1.

FIG. 3 is a perspective diagram illustrating a memory block BLKa that may be associated with the memory cell array 100 of FIG. 1.

Referring to FIG. 3, the memory block BLKa may be formed in direction vertical to a substrate SUB. A common source line CSL extending in a second horizontal direction HD2 (i.e., a Y direction) may be provided on the substrate SUB. Between two adjacent common source lines CSL on the substrate SUB, insulating layers IL extending in the second horizontal direction HD2 may be sequentially provided in a vertical direction VD (i.e., a Z direction), wherein the insulating layers IL may be apart from each other in the vertical direction VD by a predetermined distance. Between two adjacent common source lines CSL on the substrate SUB, pillars P sequentially arranged in a first horizontal direction HD1 (i.e., an X direction) and penetrating the insulating layers IL in the vertical direction VD may be provided. A surface layer S of each pillar P may include a silicon material having a first type and may function as a channel region. An inner layer I of each pillar P may include an insulating material such as silicon oxide or an air gap.

Between two adjacent common source lines CSL, a charge storage layer CS may be provided along exposed surfaces of the insulating layers IL, the pillars P, and the substrate SUB. For example, the charge storage layer CS may have an oxide-nitride-oxide (ONO) structure. Also, between two adjacent common source lines CSL, a gate electrode GE, such as selection lines GSL and SSL and word lines WL0 through WL7, may be provided on an exposed surface of the charge storage layer CS. Drains DR may be provided on the pillars P, respectively. Bit lines BL1 through BL3 extending in the first horizontal direction HD1 may be provided on the drains DR.

Figure 4:
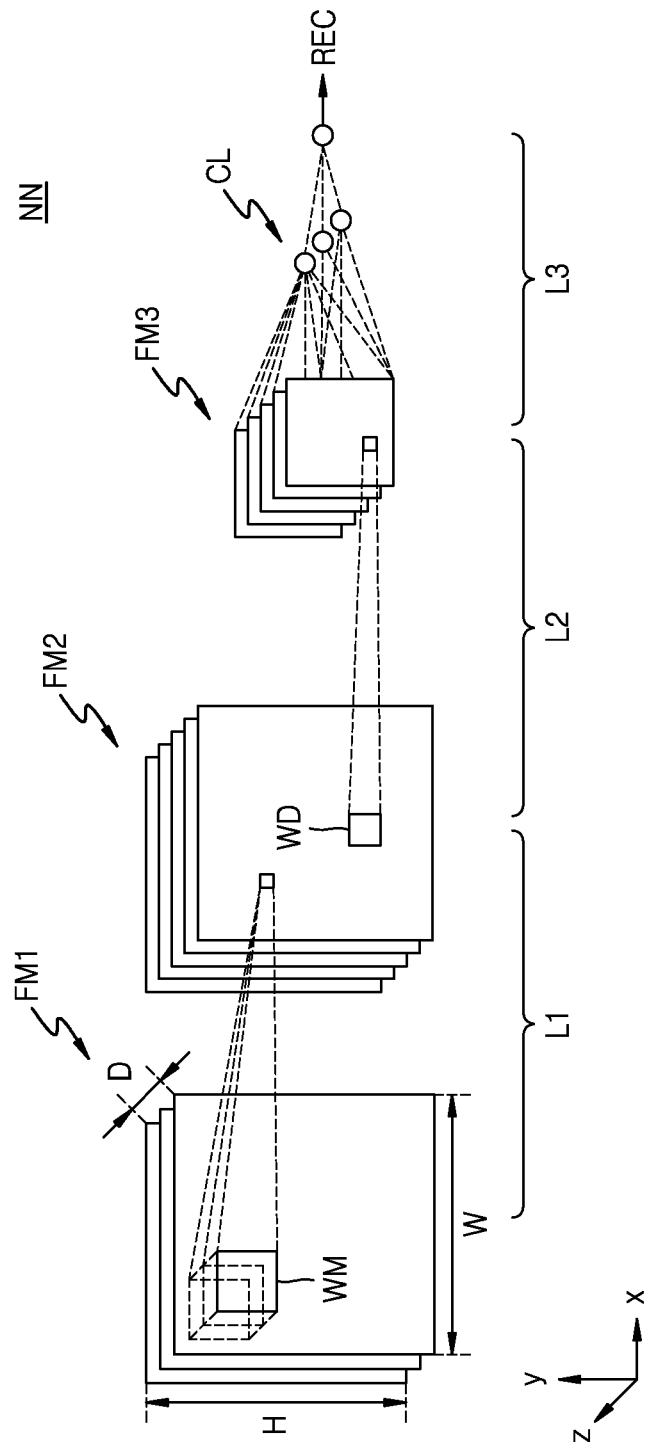
FIG. 4 is a conceptual diagram illustrating one approach to a neural network and a calculation process using the neural network according to embodiments of the inventive concept.

FIG. 4 is a conceptual diagram illustrating a neural network NN and an exemplary calculation process using the neural network NN according to embodiments of the inventive concept.

Referring to FIG. 4, the neural network NN may include a multiplicity layers (e.g., layers L1 through Ln). Each of the layers L1 through Ln may be a linear layer or a non-linear layer. In some embodiments, at least one linear layer and at least one non-linear layer may be combined and referred to as a layer. In this regard, the linear layer may include a convolution layer and a fully connected layer, whereas the non-linear layer may include a sampling layer, a pooling layer, and an activation layer.

Relative to the illustrated example of FIG. 4, a first layer L1 may be a convolution layer, and a second layer L2 may be a sampling layer. The neural network NN may further include an activation layer, as well as other layers performing other types of calculations.

Each of the layers may receive an input feature map generated from image data either received from an external source or generated by a previous layer. Upon receiving the input feature map, a layer may calculate an output feature map.

Thus, in FIG. 4, the first layer L1 may form a convolution of a first feature map FM1 with a weight map WM to generate a second feature map FM2. The weight map WM may filter the first feature map FM1 and may be referred to as a filter or a kernel. For example, a depth of the weight map WM (e.g., a number of channels), may be the same as a depth of the first feature map FM1, such that the same channels of the weight map WM and the first feature map FM1 may be formed as a convolution. The weight map WM may be shifted via a crossing method using the first feature map FM1 as a sliding window. The amount of shifting may be referred to as a "length of a stride" or a "stride." During each shift, each of weights included in the weight map WM may be multiplied and added by all feature values in a region overlapping the first feature map FM1. As a convolution of the first feature map FM1 with the weight map WM is formed, one channel of the second feature map FM2 may be generated.

The illustrated example of FIG. 4 assumes the use of one weight map WM. However, actual implementations, multiple weight maps may form a convolution with the first feature map FM1 to generate channels of the second feature map FM2. That is, the number of channels of the second feature map FM2 may correspond to the number of weight maps.

The second layer L2 may generate a third feature map FM3 by changing a spatial size of the second feature map FM2. For example, the second layer L2 may be a sampling layer. The second layer L2 may perform up-sampling or down-sampling, and the second layer L2 may select part of data included in the second feature map FM2. For example, a 2D window WD may be shifted on the second feature map FM2 in units of a size of the window WD (e.g., a 4*4 matrix), and a value of a predetermined location (e.g., a first row, a first column) in a region overlapping the window WD may be selected. The second layer L2 may output the selected data as data of the third feature map FM3. As another example, the second layer L2 may be a pooling layer. In this case, the second layer L2 may select, from the second feature map FM2, a maximum value (max pooling) or an average value (average pooling) of feature values in the region overlapping the window WD.

Accordingly, the third feature map FM3 may be generated by changing the spatial size of the second feature map FM2. The number of channels of the third feature map FM3 may be the same as the number of channels of the second feature map FM2. Thus, in some embodiments, a calculation speed of the sampling layer may be greater than a calculation speed of the pooling layer, and the sampling layer may improve the quality of an output image (e.g., in terms of a peak signal to noise ratio (PSNR)). Here, for example, the calculation by the pooling layer may include calculating a maximum value or an average value, and thus, may require a greater calculation time than the calculation by the sampling layer.

In some embodiments, the second layer L2 is not limited to the sampling layer or the pooling layer. That is, the second layer L2 may be a convolution layer similar to the first layer L1. The second layer L2 may generate the third feature map FM3 by forming a convolution of the second feature map FM2 with a weight map. In this case, the weight map on which the second layer L2 performs the convolution calculation may be different from the weight map WM on which the first layer L1 performs the convolution calculation.

An $N^{th}$ feature map may be generated by an $N^{th}$ layer through layers including the first layer L1 and the second layer L2. The $N^{th}$ feature map may be input to a reconstruction layer located at a back end of the neural network NN from which output data is provided. The reconstruction layer may generate an output image based on the $N^{th}$ feature map. Also, the reconstruction layer may receive feature maps including the first feature map FM1 and the second feature map FM2, rather than just the $N^{th}$ feature map, and may generate an output image based on the feature maps. A third layer L3 may generate an output signal REC by combining features of the third feature map FM3. For example, the output signal REC may include at least one of an optimum program voltage value with respect to a target word line (e.g., an optimum read voltage value, an incremental step pulse program (ISPP), an optimum erase voltage value, an incremental step pulse erase (ISPE), a program voltage pulse width, a program loop control, an erase voltage pulse width, an erase loop control value, etc.).

Figure 5:
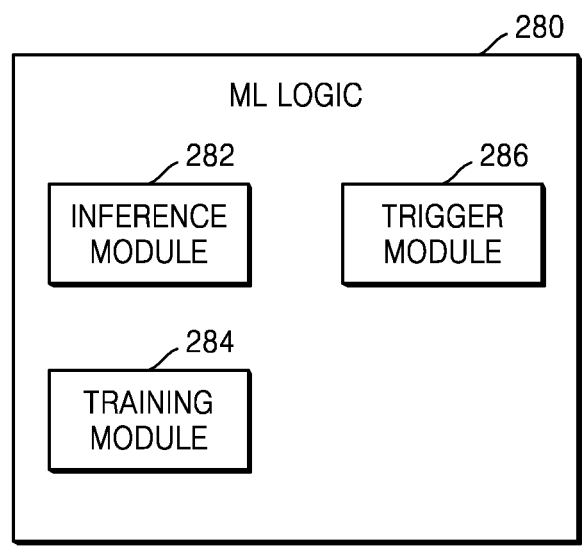
FIG. 5 is a block diagram illustrating machine learning (ML) logic according to embodiments of the inventive concept.

FIG. 5 is a block diagram further illustrating the ML logic 280 of FIG. 1 according to embodiments of the inventive concept.

Referring to FIG. 5, the ML logic 280 may include an inference module 282, a training module 284, and a trigger module 286.

In some embodiments, the inference module 282 may be used to generate an output corresponding to an input based on weight parameters of an artificial neural network model that has completed learning (or training). In this regard, the inference module 282 may receive at least one of chip-level information, physical information, and operation information as the input.

"Operation information" may include values obtained during the execution of one or more program, read, and/or erase operations. For example, operation information may include memory cell speed information, count information indicating a number of ON-cells and/or a number of OFF-cells in response to a verify voltage, a number of verify pass loops, information associated with a distribution shape, information associated with a degree of retention deterioration, information associated with a write pattern for adjacent cells, temperature information, etc. Operation information may also be alternately be referred to as monitoring information, cell state information, real time information, etc.

"Physical information" may include information with respect to program, read, and/or erase target cell(s), block information for the program, read, or erase target cell, word line information for the target cell, string selection information for the target cell, etc.

In some embodiments, the training module 284 may be used to perform training on the artificial neural network model. The training module 284 may update optimum weight parameters by training the artificial neural network model based on the chip-level information, the physical information, and the operation information. For example, the training module 284 may load, from the buffer memory 270, count information about the number of ON-cells and/or OFF-cells in response to a verify voltage, memory cell speed information, such as a number of loops performed to complete programming or erasing, and a degree of deterioration for data stored in a memory cell due to retention of the data. The count information, cell speed information, and cell retention information may have different values than those associated with a time at which the artificial neural network model was previously trained. Thus, the training module 284 may train the artificial neural network model based on the updated count information, updated memory cell speed information, and updated memory cell retention information. Hence, the re-trained artificial neural network model may have weight parameters that are different from the weight parameters of the previously-trained neural network model.

In some embodiments, the ML logic 280 may include only the inference module 282. In this case, the ML logic 280 may perform only the inference operation based on the weight parameters of the pre-trained artificial neural network model. Thus, new training based on updated cell speed information, updated count information, and updated memory cell retention information may not be performed.

In other embodiments, the ML logic 280 may include the inference module 282, the training module 284, and the trigger module 286. Here, the trigger module 286 may correspond to a module configured to determine whether or not to activate the training module 284. For example, the trigger module 286 may activate the training module 284 based on a standby time, a result of a comparison between the count information and a threshold value, or a result of a comparison between the memory cell speed information and a threshold value.

In some embodiments, the trigger module 286 may identify whether or not a standby time since a performing a particular program, read, and/or erase operation has been performed. Upon determining that the standby time exceeds a predetermined first threshold value, the trigger module 286 activate the training module 284. In order to make this identification, the trigger module 286 may include a timer circuit (not shown). When the standby time exceeds the first threshold value, the trigger module 286 may activate the training module 284 and may input the memory cell speed information and the count information stored in the buffer memory 270 to the training module 284. That is, the trigger module 286 may initiate training of the artificial neural network module during the standby time during which programming, reading, and erasing are not performed in order to infer an optimum program voltage, an optimum read voltage, and/or an optimum erase voltage. Alternatively, in some embodiments, the trigger module 286 may receive a request of a memory controller and may activate the training module 284 in response to the request. When a program command or a read command is not received from a host during a predetermined time period, the memory controller may determine to train the artificial neural network model and may transmit an additional command instructing the training of the artificial neural network to the trigger module 286.

In some embodiments, the trigger module 286 may activate the training module 284 in response to a comparison between the memory cell speed information and a threshold value, or in response to a comparison between the count information and a threshold value. In this regard, the performance of the memory cell array 100 may deteriorate over time, as program and erase operations are repeatedly performed.

The threshold value may correspond to a reference value for determining that a desired performance improvement has not been achieved by the voltage derived (or inferred) by the pre-trained artificial neural network. For example, when a memory cell speed is detected that is less than a predetermined reference speed, the trigger module 286 may activate the training module 284. As another example, when a number of OFF-cells exceeds a pre-defined reference number, the trigger module 286 may activate the training module 284 to reflect the degree of performance deterioration for the memory cell array 100.

In some embodiments, the trigger module 286 may not only trigger the training module 284, but may also trigger a backup of data stored in the buffer memory 270 to a meta region of the memory cell array 100. For example, assuming that buffer memory 270 is a volatile memory, the trigger module 286 may identify whether or not a pre-defined standby time has passed after a changed weight parameter is stored in the buffer memory 270, or may periodically receive from the memory controller a command requesting a backup of the buffer memory 270. When the pre-defined standby time has passed, or when the command requesting the backup is received, the trigger module 286 may trigger the control logic 220 to write a changed weight parameter of the buffer memory 270, an inferred optimum word line voltage value, data of an intermediate output, etc., to the meta region of the memory cell array 100.

Figure 6:
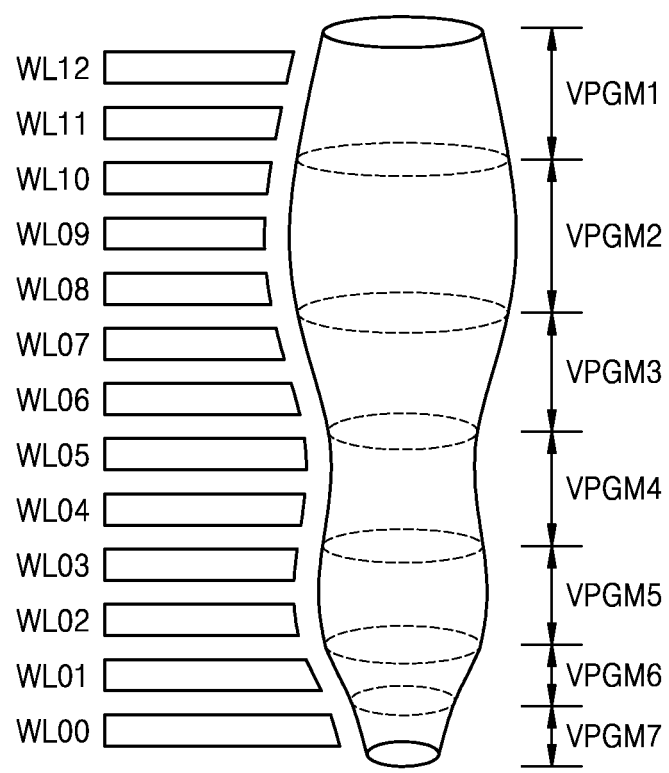
FIG. 6 is a conceptual diagram illustrating a comparative example in which different program voltages are respectively applied to different word lines.

FIG. 6 is a conceptual diagram illustrating a comparative example in which program voltages vary according to word line.

Referring to FIG. 6, as the number of stacked word lines increases, variations among memory cells may also increase. That is, the control logic 220 may group word lines into one or more groups and may apply an optimum voltage to each of the groups during an optimization period. Referring to FIG. 6, as the size (e.g., a width) of a channel hole varies across a range of different vertical levels respectively associated with different word lines, a voltage (e.g., a program voltage, a read voltage, an erase voltage, a pulse apply time, etc.) applied to each of the word lines will also vary.

For example, in order to perform a program operation on each word line according to the same distribution, the control logic 220 may apply a first program voltage VPGM1 when a twelfth word line WL12 is programmed, and a sixth program voltage VPGM6 when a cell located in a first word line WL1 is programmed, wherein the first program voltage VPGM1 and the sixth program voltage VPGM6 are different. Hence, word lines having similar characteristics may be grouped, and an optimum program voltage and an optimum program time for each of the groups may be managed using (e.g.,) a mapping table. However, as the number of stacked layers increases so too does the resulting size of the mapping table, and optimization may become difficult. In contrast, by managing word lines having similar characteristics using an artificial neural network model and the ML logic 280, relatively more sophisticated optimization may be performed even as the number of stacked layers increases.

Figure 7:
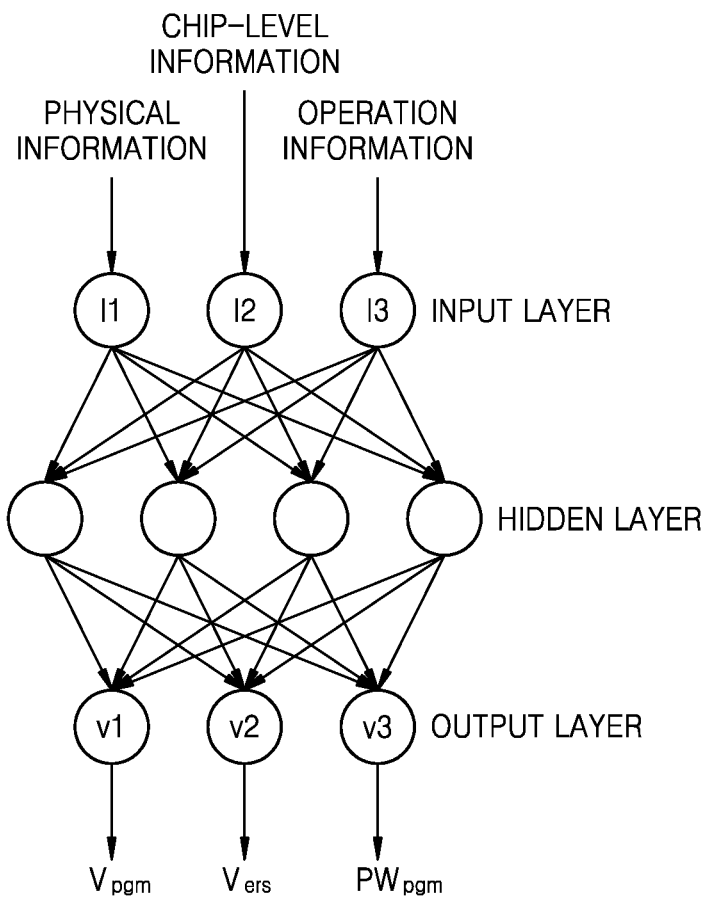
FIG. 7 is a conceptual diagram illustrating an artificial neural network model according to an embodiments of the inventive concept.

FIG. 7 is a conceptual diagram illustrating an artificial neural network model according to embodiments of the inventive concept.

Referring to FIG. 7, the artificial neural network model may be used to infer an optimum program voltage $V_{prm}$, an optimum erase voltage $V_{ers}$, an optimum program voltage pulse width $PW_{pgm}$, etc., in relation to inputs, such as physical information including block information for a program target cell, word line information, and string selection line information; chip-level information including wafer location information, wafer reliability information, and P/E cycle information, operation information including a number of read counts, count information for OFF-cells and/or ON-cells in response to a verify voltage, etc.

Hence, the artificial neural network model may include input nodes I1, I2 and I3 provided in one or more input layer(s), hidden nodes included in at least one hidden layer, and output nodes v1, v2 and v3 included in one or more output layer(s). Weight parameters stored in the buffer memory 270 may be values for determining a proceeding direction when an operation proceeds from a node to a next node, and intrinsic values for all proceeding directions which are possible for each node may be determined via training.

The illustrated example of FIG. 7 assumes only a single hidden layer, but the inventive concept is not limited thereto. In some embodiments, in correspondence to an error permission range with respect to an optimum program voltage, an optimum read voltage, and an optimum erase voltage, and the performance of the nonvolatile memory device 10, the number of hidden nodes and the number and the structure of hidden layers may vary.

Figure 8:
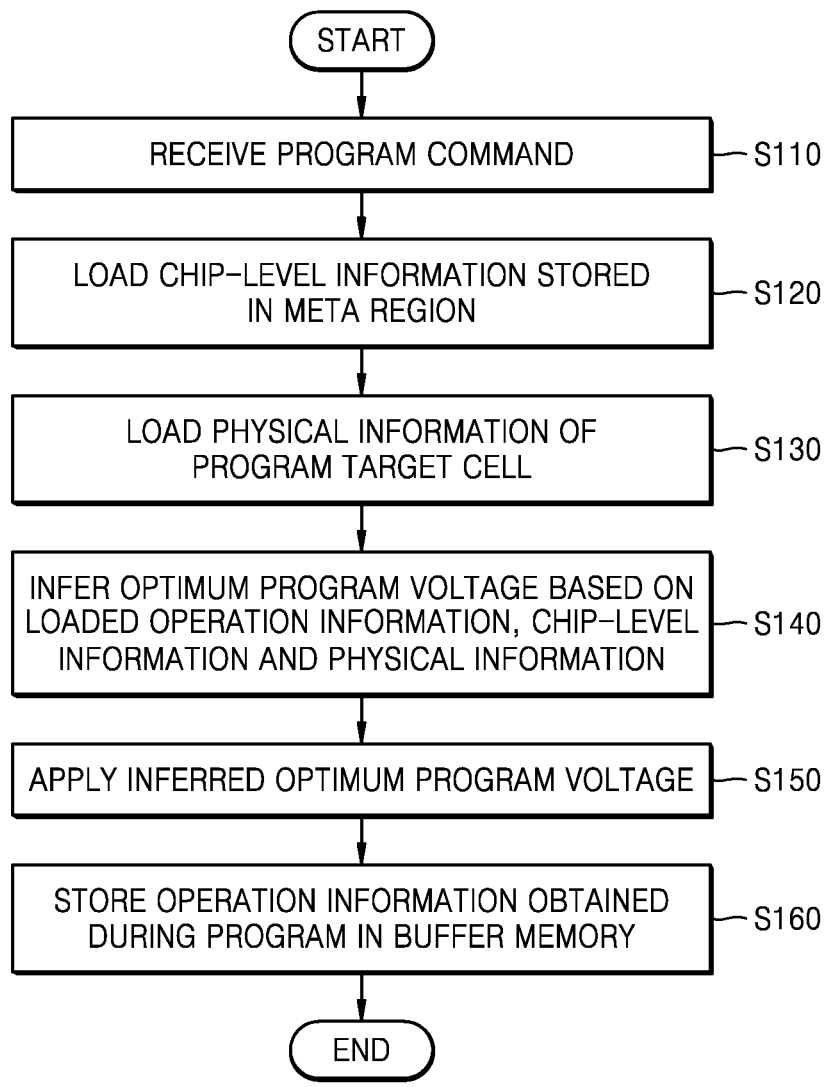
FIGS. 8 and 9 are respective flowcharts illustrating operating method(s) for a nonvolatile memory device according to embodiments of the inventive concept.

FIG. 8 is a flowchart illustrating, at least in part, a program operation performed by the nonvolatile memory device 10 of FIG. 1 according to embodiments of the inventive concept.

Referring to FIG. 8, the control logic 220 may receive a program command CMD (S110). Accordingly, the control logic 220 may identify a program target cell through an address provided with the program command CMD.

The ML logic 280 may then load chip-level information stored in the meta region 110 (S120). The chip-level information may include wafer location information, wafer reliability information, etc. The ML logic 280 may load the chip-level information to the buffer memory 270. In some embodiments, the ML logic 280 may load the chip-level information to the buffer memory 270 before the ML logic 280 receives a control signal from the control logic 220. For example, upon power-up of the nonvolatile memory device 10, the ML logic 280 may pre-load the chip-level information to the buffer memory 270.

The ML logic 280 may load physical information of the program target cell (S130). The control logic 220 may obtain location information associated with the program target cell by decoding the program command CMD. The control logic 220 may communicate as inputs to the ML logic 280 block information of the program target cell, word line information, and string selection information, for example.

Then, the ML logic 280 may infer an optimum program voltage based on the loaded operation information, chip-level information, and physical information (S140). The ML logic 280 may output the optimum program voltage value according to the wafer location information and the wafer reliability information of the chip-level information and the address of the program target cell.

The control logic 220 may then apply the inferred optimum program voltage (S150). For example, the control logic 220 may receive the optimum program voltage value inferred by the ML logic 280 and may transmit the received program voltage value to the voltage generator 230 to perform a program operation.

The control logic 220 may store the operation information obtained by performing the program operation in the buffer memory 270 (S160). Here, the operation information may be changed (or updated) whenever a program, read, erase operations is performed, and the changed operation information may be used for the subsequent inference operations, as well as training of the artificial neural network model. Thus, when the program operation is completed, the control logic 220 may control the buffer memory 270 to store updated memory cell speed information, number of ON-cells and OFF-cells, number of loops required for verify pass, information about a distribution shape, information about a degree of retention deterioration, etc.

The illustrated example of FIG. 8, assumes the execution of a programming operation executed by nonvolatile memory device 10. However, the inventive concept is not limited thereto, and similar methods steps may be performed in relation to read operations and/or erase operations.

Figure 9:
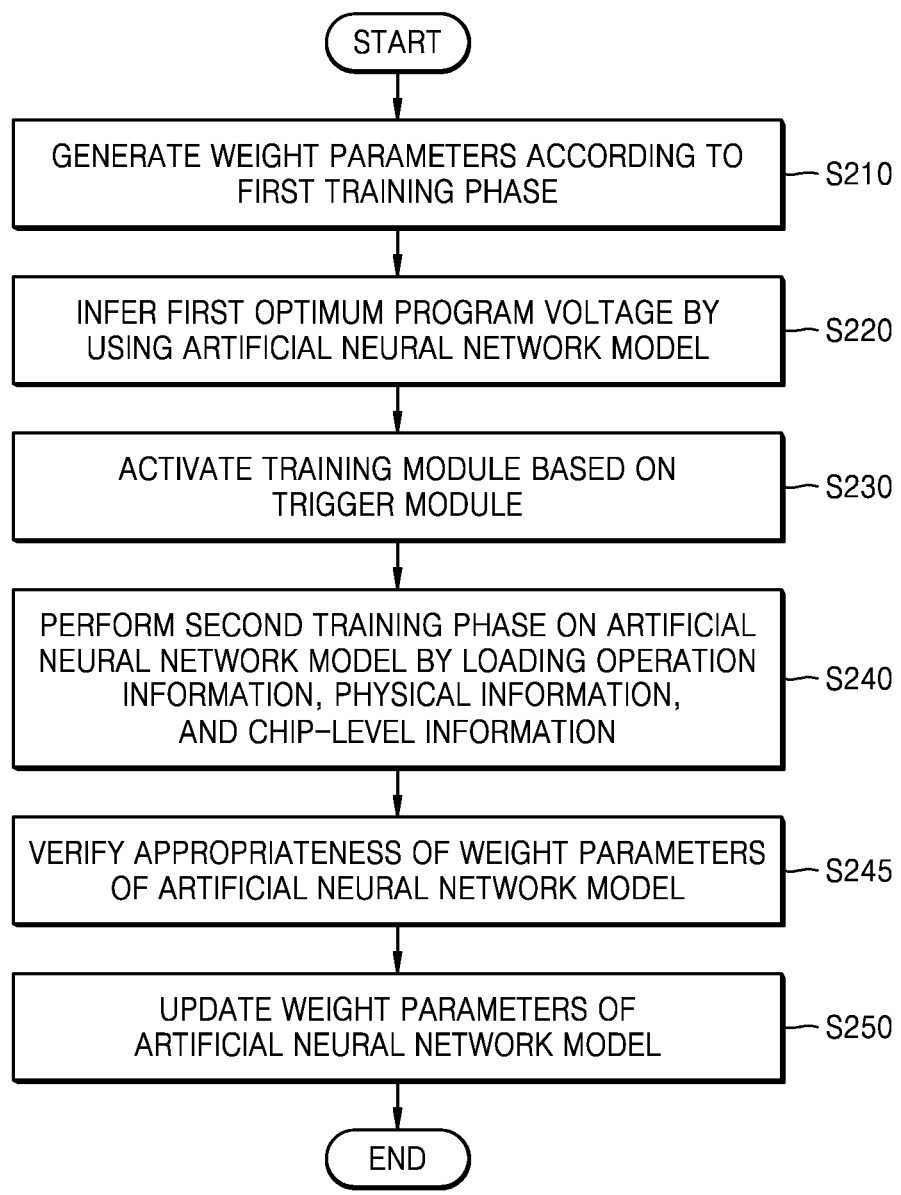

FIG. 9 is a flowchart illustrating, at least in part, operation of the nonvolatile memory device 10 of FIG. 1 according to embodiments of the inventive concept.

Referring to FIG. 9, the ML logic 280 may generate weight parameters according to a first training phase (S210). Here, the first training phase may be performed using only chip-level information prior to shipping of a product.

The ML logic 280 may infer a first optimum program voltage using an artificial neural network model (S220). In this regard, method step S220 may include operations S110 through S150 of FIG. 8. The first optimum program voltage may refer to a value output from the inference module 282 following training during the first training phase.

The ML logic 280 may activate the training module 284 by using the trigger module 286 (S230). Here, the trigger module 286 may activate the training module 284 by detecting a pre-defined event. In some embodiments, when the trigger module 286 does not receive a program command and an erase command after a pre-defined standby time has passed, the trigger module 286 may activate the training module 284. In other embodiments, the trigger module 286 may count a certain type of memory cell (e.g., memory cell having speeds less than a predetermined speed, etc.) in order to activate the training module 284. In still other embodiments, the trigger module 286 may apply a post program verify voltage or a post erase verify voltage and count a number of OFF-cells. Should the number of OFF-cells exceed a pre-defined number, the trigger module 286 may activate the training module 284. In yet other embodiments, the trigger module 286 may receive a command instructing a training operation of the artificial neural network model from a memory controller and may activate the training module 284 in response to the command.

The ML logic 280 may perform a second training phase on the artificial neural network model by loading the operation information, physical information, and chip-level information (S240). The training module 284 of the ML logic 280 may perform the training in relation to the location information of a program target cell, a location of the target cell, wafer location information, count information about the number of OFF-cells and ON-cells in response to a post program or post erase verify voltage, etc.

According to the second training phase, the weight parameters generated in the first training phase may be changed (or updated). The weight parameters updated through the second training phase may further reflect information associated with memory cells that deteriorate after repeatedly performing program and erase operations after the first training phase, and thus, may be used to infer a second optimum program voltage in the changed state of the memory cell array 100.

The ML logic 280 may verify appropriateness of the weight parameters of the artificial neural network model (S245). In this regard, the ML logic 280 may pre-set a permissible range with respect to the weight parameters. This may prevent a situation in which an artificial neural network model is trained (or biased) in response to a random or errant input, such that an out-of-bounds optimum program voltage value, an optimum read voltage value, or an optimum erase voltage value is not generated.

In some embodiments, the ML logic 280 may determine whether the weight parameters included in the artificial neural network model deviate from the permissible range, whenever the training is completed. When weight parameters that deviate from the permissible range are identified, the ML logic 280 may re-set values of the identified weight parameters as values within the permissible range.

In some embodiments, the ML logic 280 may adjust a hyper parameter. The hyper parameter may be a parameter affecting the training operation of the artificial neural network model, rather than the weight parameters between nodes of the artificial neural network model. For example, the hyper parameter may include at least one of; a number of hidden layers, a learning rate, a number of training iterations, a batch size, a regularization strength, etc. For example, when weight parameters deviating from the permissible range are identified, the ML logic 280 may perform weight initialization, and then, divide a training data set into a first data set for verifying the hyper parameter and a second data set for training. The ML logic 280 may change the hyper parameter of the artificial neural network model of the first data set and compare the changed hyper parameter with a result of the second data set to obtain an optimum hyper parameter.

The ML logic 280 may then update the weight parameters of the artificial neural network model (S250). While performing the second training phase, the ML logic 280 may store values of the changed weight parameters in the buffer memory 270. For example, when the changed weight parameters are stored in the buffer memory 270 and a pre-defined time has passed, the trigger module 286 may trigger the control logic 220 to store the changed weight parameters of the buffer memory 222 in the meta region of the memory cell array 100, in order to prevent a loss of the changed weight parameters due to a sudden power off (SPO) phenomenon.

In foregoing embodiments, the ML logic 280 has been described by focusing on its operation of inferring an optimum program voltage. However, the ML logic 280 is not limited thereto. In some embodiments, the ML logic 280 may include at least one of an optimum read voltage value, an ISPP, an optimum erase voltage value, an ISPE, a pulse width of a program voltage, a program loop control, a pulse width of an erase voltage, and an erase loop control value. For example, the ML logic 280 may change a start voltage level of the ISPP, a verify voltage level, a number of ISPP voltage pulses, a voltage rise interval for the ISPP voltage pulses, etc., to be optimized for a changed state of the memory cell array 100.

It should be noted here that the ML logic 280 may be based on any one of a decision tree, a neural network model, and linear regression. However, the ML logic 280 is not limited thereto. In some embodiments, the ML logic 280 may infer the optimum program voltage based on a combination of at least two of the decision tree, the neural network model, and the linear regression. For example, the ML logic 280 may infer the optimum program voltage based on the decision tree for meta information, based on the neural network model for the physical information, and based on the linear regression for the operation information.

Figure 10:
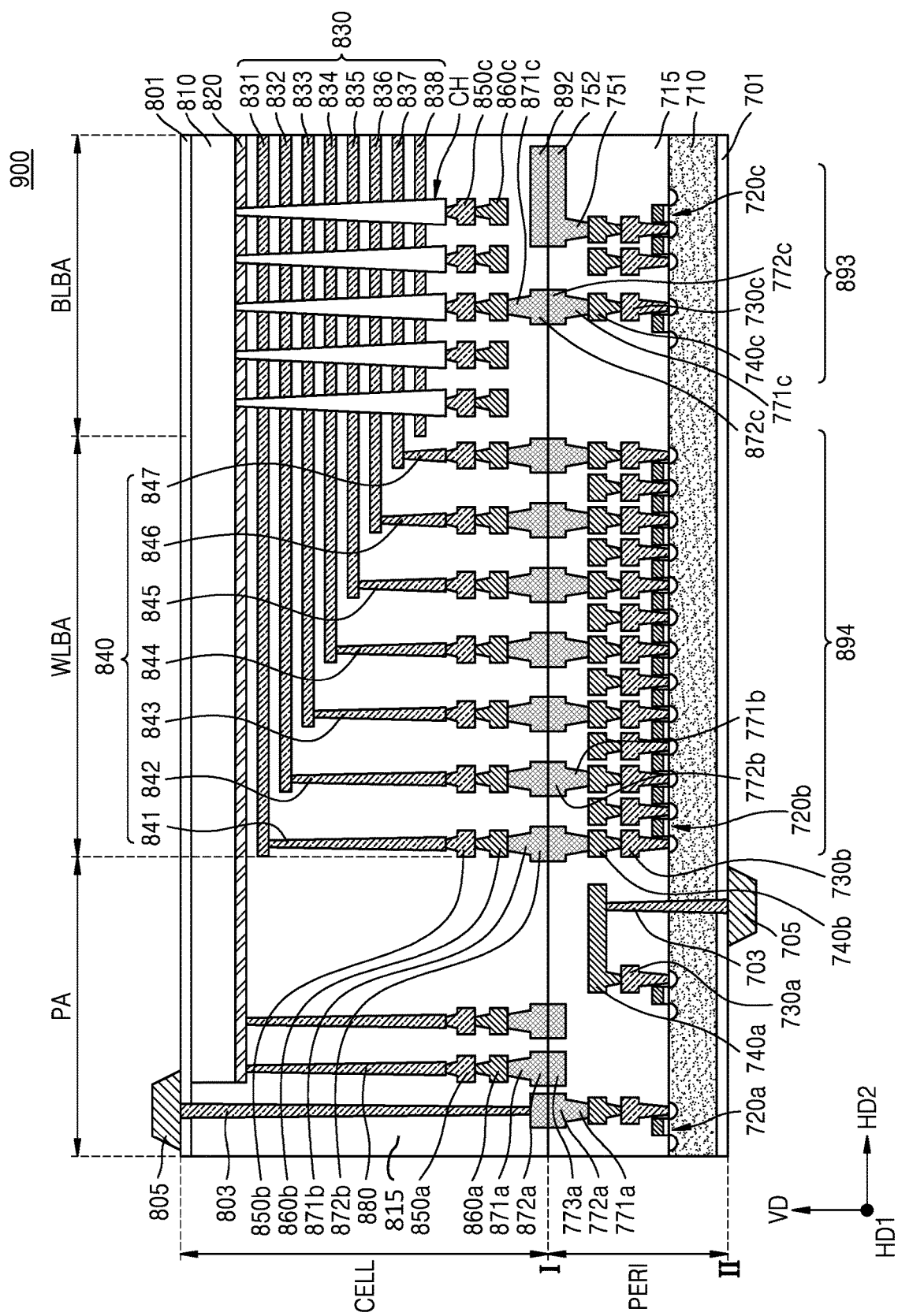
FIG. 10 is a cross-sectional diagram illustrating a nonvolatile memory device according to embodiments of the inventive concept.

FIG. 10 is a cross-sectional diagram illustrating a memory device 900 according to embodiments of the inventive concept.

Referring to FIG. 10, the memory device 900 may have a C2C structure consistent with the description above. The embodiments illustrated in FIGS. 1 through 9 may be implemented in the memory device 900. For example, the ML logic 280 described with reference to FIGS. 1 through 9 may be implemented in the peripheral circuit region PERI.

Each of the peripheral circuit region PERI and the cell region CELL of the memory device 900 may include an external pad bonding area PA, a word line bonding area WLBA, and a bit line bonding area BLBA. The peripheral circuit region PERI may include a first substrate 710, an interlayer insulating layer 715, circuit devices 720a, 720b, and 720c formed on the first substrate 710, first metal layers 730a, 730b, and 730c respectively connected to the circuit devices 720a, 720b, and 720c, and second metal layers 740a, 740b, and 740c respectively formed on the first metal layers 730a, 730b, and 730c. In some embodiments, the first metal layers 730a, 730b, and 730c may include W that has a relatively high resistance, and the second metal layers 740a, 740b, and 740c may include Cu that has a relatively low resistance.

In the illustrated example of FIG. 10, only the first metal layers 730a, 730b, and 730c and the second metal layers 740a, 740b, and 740c are shown and described. However, the inventive concept is not limited thereto, and one or more metal layers may further be formed on the second metal layers 740a, 740b, and 740c. At least one of the one or more metal layers formed on the second metal layers 740a, 740b, and 740c may include Al, etc. that have a lower resistance than Cu included in the second metal layers 740a, 740b, and 740c. The interlayer insulating layer 715 may be arranged on the first substrate 710 to cover the circuit devices 720a, 720b, and 720c, the first metal layers 730a, 730b, and 730c, and the second metal layers 740a, 740b, and 740c, and may include an insulating material, such as silicon oxide, silicon nitride, etc.

Lower bonding metals 771b and 772b may be formed on the second metal layer 740b in the word line bonding area WLBA. That is, in the word line bonding area WLBA, the lower bonding metals 771b and 772b of the peripheral circuit region PERI may be electrically connected to upper bonding metals 871b and 872b of the cell region CELL by a bonding manner. Also, the lower bonding metals 771b and 772b and the upper bonding metals 871b and 872b may include Al, Cu, W, or the like. The upper bonding metals 871b and 872b of the cell region CELL may be referred to as first metal pads, and the lower bonding metals 771b and 772b of the peripheral circuit region PERI may be referred to as second metal pads.

The cell region CELL may provide at least one memory block. The cell region CELL may include a second substrate 810 and a common source line 820. Word lines 830 (e.g., word lines 831 through 838) may be stacked on the second substrate 810 in a vertical direction VD to an upper surface of the second substrate 810. String selection lines and a ground selection line may be respectively arranged above and below the word lines 830, and the word lines 830 may be arranged between the string selection lines and the ground selection line.

In the bit line bonding area BLBA, a channel structure CH may extend in the vertical direction VD to the upper surface of the second substrate 810 and may penetrate the word lines 830, the string selection lines, and the ground selection line. The channel structure CH may include a data storage layer, a channel layer, a buried insulating layer, etc., and the channel layer may be electrically connected to a first metal layer 850c and a second metal layer 860c. For example, the first metal layer 850c may be a bit line contact, and the second metal layer 860c may be a bit line. According to an embodiment, the bit line 860c may extend in a first horizontal direction HD1 parallel to the upper surface of the second substrate 810.

In an embodiment illustrated in FIG. 10, a region in which the channel structure CH and the bit line 860c are arranged may be defined as the bit line bonding area BLBA. In the bit line bonding area BLBA, the bit line 860c may be electrically connected to the circuit devices 720c providing a page buffer 893 in the peripheral circuit region PERI. For example, the bit line 860c may be connected to upper bonding metals 871c and 872c in the peripheral circuit region PERI, and the upper bonding metals 871c and 872c may be connected to lower bonding metals 771c and 772c connected to the circuit devices 720c of the page buffer 893.

In the word line bonding area WLBA, the word lines 830 may extend in a second horizontal direction HD2 that is parallel to the upper surface of the second substrate 810 and may be connected to cell contact plugs 840 (e.g., cell contact plugs 841 through 847). The word lines 830 and the cell contact plugs 840 may be connected to each other via pads provided by one or more of the word lines 830, the one or more of the word lines 830 extending in the second horizontal direction HD2 in different lengths. A first metal layer 850b and a second metal layer 860b may be sequentially connected above the cell contact plugs 840 connected to the word lines 830. In the word line bonding area WLBA, the cell contact plugs 840 may be connected to the peripheral circuit region PERI through the upper bonding metals 871b and 872b of the cell region CELL and the lower bonding metals 771b and 772b of the peripheral circuit region PERI.

The cell contact plugs 840 may be electrically connected to the circuit devices 720b providing a row decoder 894 in the peripheral circuit region PERI. In some embodiments, an operation voltage of the circuit devices 720b providing the row decoder 894 may be different from an operation voltage of the circuit devices 720c providing the page buffer 893. For example, the operation voltage of the circuit devices 720c providing the page buffer 893 may be greater than the operation voltage of the circuit devices 720b providing the row decoder 894.

A common source line contact plug 880 may be arranged in the external pad bonding area PA. The common source line contact plug 880 may include a conductive material, such as metal, a metal compound, polysilicon, or the like, and may be electrically connected to the common source line 820. A first metal layer 850a and a second metal layer 860a may be sequentially stacked above the common source line contact plug 880 and connected to upper metal pattern 872a by upper bonding metal 871a. For example, a region in which the common source line contact plug 880, the first metal layer 850a, and the second metal layer 860a are arranged may be defined as the external pad bonding area PA.

A first input and output pad 705 and a second input and output pad 805 may be arranged in the external pad bonding area PA. Referring to FIG. 10, a lower insulating layer 701 covering a lower surface of the first substrate 710 may be formed below the first substrate 710, and the first input and output pad 705 may be formed on the lower insulating layer 701. The first input and output pad 705 may be connected to at least one of the circuit devices 720a, 720b, and 720c arranged in the peripheral circuit region PERI through a first input and output contact plug 703 and may be insulated from the first substrate 710 through the lower insulating layer 701. Also, a side surface insulating layer may be arranged between the first input and output contact plug 703 and the first substrate 710 to electrically separate the first input and output contact plug 703 from the first substrate 710.

Referring to FIG. 10, an upper insulating layer 801 covering the upper surface of the second substrate 810 may be formed above the second substrate 810, and the second input and output pad 805 may be arranged on the upper insulating layer 801. The second input and output pad 805 may be connected to at least one of the circuit devices 720a, 720b, and 720c arranged in the peripheral circuit region PERI through a second input and output contact plug 803 and the lower bonding metals 771a and 772a.

In some embodiments, in the region in which the second input and output contact plug 803 is arranged, the second substrate 810, the common source line 820, etc. may not be arranged. Also, the second input and output pad 805 may not overlap the word lines 830 in the vertical direction VD.

In some embodiments, the second input and output contact plug 803 may be separated from the second substrate 810 in a direction parallel to the upper surface of the second substrate 810 and may be connected to the second input and output pad 805 by penetrating the interlayer insulating layer 815 of the cell region CELL.

In some embodiments, the first input and output pad 705 and the second input and output pad 805 may be selectively formed. For example, the memory device 800 may include only the first input and output pad 705 arranged above the first substrate 710 or may include only the second input and output pad 805 arranged above the second substrate 810. Alternately, the memory device 800 may include both the first input and output pad 705 and the second input and output pad 805.

A metal pattern of an uppermost metal layer may be present as a dummy pattern in each of the external pad bonding area PA and the bit line bonding area BLBA included in each of the cell region CELL and the peripheral circuit region PERI, or the uppermost metal layer may be empty.

In the memory device 800, in the external pad bonding area PA, a lower metal pattern 773a having the same shape as an upper metal pattern 872a of the cell region CELL may be formed on an uppermost metal layer of the peripheral circuit region PERI to correspond to the upper metal pattern 872a formed on an uppermost metal layer of the cell region CELL. The lower metal pattern 773a formed on the uppermost metal layer of the peripheral circuit region PERI may not be connected to an additional contact in the peripheral circuit region PERI. Similarly, in the external pad bonding area PA, the upper metal pattern 872a having the same shape as the lower metal pattern 773a of the peripheral circuit region PERI may be formed on the uppermost metal layer of the cell region CELL to correspond to the lower metal pattern formed on the uppermost metal layer of the peripheral circuit region PERI.

The lower bonding metals 771b and 772b may be formed on the second metal layer 740b of the word line bonding area WLBA. In the word line bonding area WLBA, the lower bonding metals 771b and 772b of the peripheral circuit area PERI may be electrically connected to the upper bonding metals 871b and 872b of the cell region CELL by a bonding manner. In the bit line bonding area BLBA, an upper metal pattern 892 having the same shape as a lower metal pattern 752 of the peripheral circuit region PERI may be formed on the uppermost metal layer of the cell region CELL to correspond to the lower metal pattern 752 formed on the uppermost metal layer of the peripheral circuit region PERI. A contact may not be formed on the upper metal pattern 892 formed on the uppermost metal layer of the cell region CELL. The lower metal pattern 752 may be connected to circuit device 720c by lower bonding metal 751.

Figure 11:
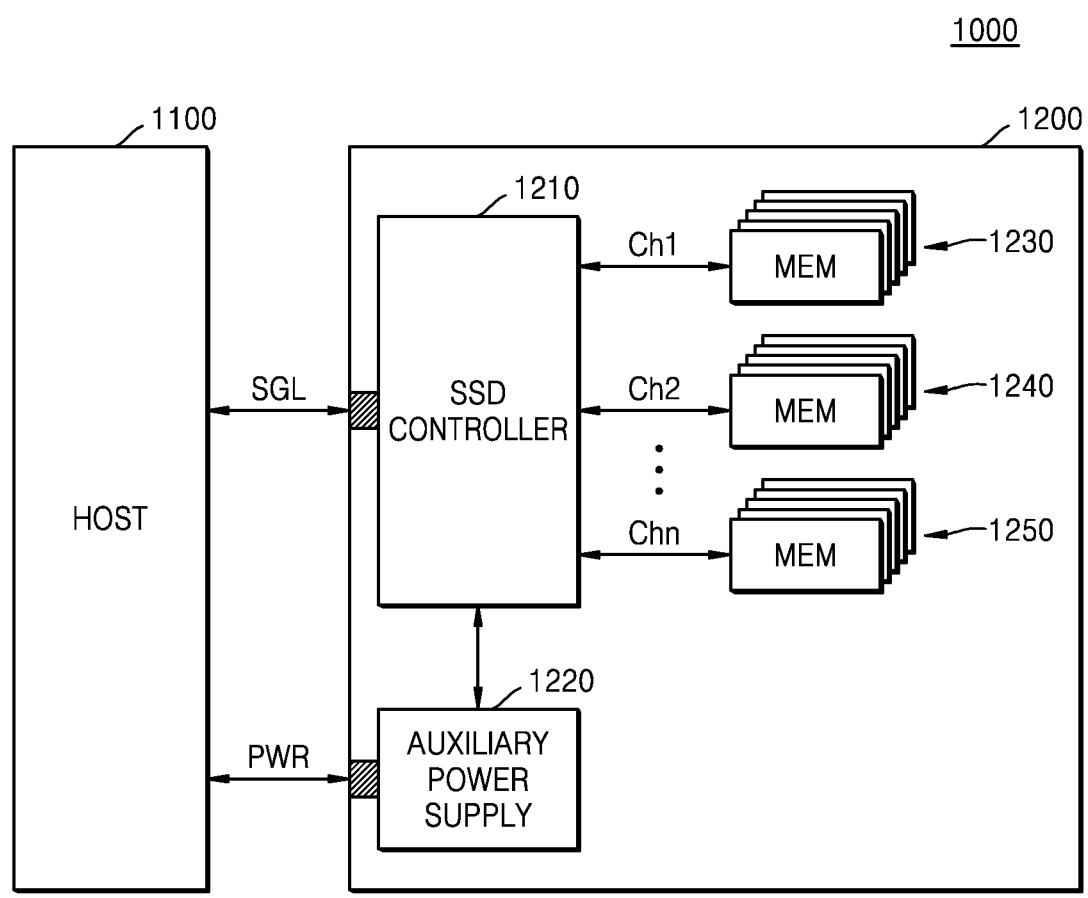
FIG. 11 is a block diagram illustrating a nonvolatile memory device implemented as a solid state drive (SSD) system according to embodiments of the inventive concept.

FIG. 11 is a block diagram illustrating a nonvolatile memory device implemented as a solid state drive (SSD) system 1000 according to embodiments of the inventive concept.

Referring to FIG. 11, the SSD system 1000 may include a host 1100 and an SSD 1200. The SSD 1200 may include an SSD controller 1210, an auxiliary power device 1220, and memory devices 1230, 1240, and 1250.

The memory devices 1230, 1240, and 1250 may be vertically stacked NAND flash memory devices. Here, the SSD 1200 may be implemented by using the embodiments described above with reference to FIGS. 1 through 10.

While the inventive concept has been particularly shown and described with reference to embodiments thereof, it will be understood that various changes in form and details may be made therein without departing from the spirit and scope of the following claims.

What is claimed is:

1. A nonvolatile memory device comprising:
a memory cell array including a meta data region storing chip-level information;
control logic configured to identify a target cell of the memory cell array in response to a received command;
machine learning (ML) logic configured to infer an optimum parameter based on the chip-level information and physical information associated with the target cell applied as inputs to an artificial neural network model; and
a buffer memory configured to store weight parameters of the artificial neural network model,
wherein the ML logic comprises
a training module configured to perform a training operation on the artificial neural network model based on the chip-level information and the physical information, and
a trigger module configured to compare a number of OFF-cells of the memory cell array with a predefined threshold value after one of a post program verify voltage and a post erase verify voltage is applied to memory cells of the memory cell array to generate a comparison result, and trigger activation of the training module in response to the comparison result.

2. The nonvolatile memory device of claim 1, wherein the artificial neural network model is based on at least one of a decision tree, a neural network, and linear regression.

3. The nonvolatile memory device of claim 1, wherein the memory cell array is implemented in a first chip manufactured on a first wafer,
the ML logic and the buffer memory are implemented on a second chip manufactured on a second wafer different from the first wafer, and
the first chip and the second chip are bonded using a chip-to-chip (C2C) bonding method.

4. The nonvolatile memory device of claim 1, wherein the ML logic further comprises an inference module configured to perform an inference operation based on the weight parameters stored in the buffer memory.

5. The nonvolatile memory device of claim 4, wherein the chip-level information includes wafer location information, wafer reliability information, and program/erase (P/E) cycle information.

6. The nonvolatile memory device of claim 4, wherein the physical information includes word line information of the target cell, block information of the target cell, and string selection line information of the target cell.

7. The nonvolatile memory device of claim 4, wherein the training module is further configured to perform the training operation based on operation information,
wherein the operation information includes at least one of memory cell speed information, count information for a number of ON-cells of the memory cell array and the number of OFF-cells in response to the one of the post program verify voltage and the post erase verify voltage, a number of program verify pass loops, information associated with a distribution shape, information indicating a retention deterioration degree, information associated with a write pattern for a cell of the memory cell array adjacent the target cell, and temperature information associated with the target cell.

8. The nonvolatile memory device of claim 7, wherein the training module is further configured to receive the chip-level information, the physical information and the operation information in response to activation by the trigger module, and update the weight parameters.

9. The nonvolatile memory device of claim 1, wherein the optimum parameter is at least one of a program voltage value, a read voltage value, a pulse width of a program voltage, a program loop control, a number of pulses and a voltage rise interval of an incremental step pulse program (ISPP), an erase voltage value, a pulse width of an erase voltage, an erase loop control, and a number of pulses and a voltage rise interval of an incremental step pulse erase (ISPE).

10. An operating method of a nonvolatile memory device, wherein the nonvolatile memory device includes a memory cell array implemented in a first chip manufactured on a first wafer and including a meta region storing chip-level information, and a peripheral region implemented on a second chip manufactured on a second wafer different from the first wafer and including a buffer memory and machine learning (ML) logic, wherein the first chip and the second chip are bonded using a chip-to-chip (C2C) bonding method, the operating method comprising:
identifying a target cell in the memory cell array in response to a received command;
loading the chip-level information from the memory cell array to the buffer memory;
loading physical information associated with the target cell to the buffer memory; and
inferring an optimum parameter, using the ML logic, based on the chip-level information and the physical information applied as inputs to an artificial neural network model,
wherein the chip-level information includes wafer location information indicative of a chip location of the first chip on the first wafer.

11. The operating method of claim 10, wherein the ML logic comprises:
an inference module performing an inference operation based on weight parameters stored in the buffer memory;
a training module performing a training operation on the artificial neural network model based on the chip-level information, the physical information, and operation information; and
a trigger module activating the training module.

12. The operating method of claim 11, wherein the operation information includes at least one of memory cell speed information, count information for a number of ON-cells and OFF-cells of the memory cell array in response to a post program verify voltage, a number of program verify pass loops, information associated with a distribution shape, information indicating a retention deterioration degree, information associated with a write pattern for a cell of the memory cell array adjacent the target cell, and temperature information associated with the target cell.

13. The operating method of claim 10, wherein the chip-level information further includes wafer reliability information and program/erase (P/E) cycle information.

14. The operating method of claim 10, wherein the physical information includes word line information of the target cell, block information of the target cell, and string selection line information of the target cell.

15. The operating method of claim 10, further comprising:
comparing a number of OFF-cells of the memory cell array with a pre-defined threshold value after one of a post program verify voltage and a post erase verify voltage is applied to memory cells of the memory cell array to generate a comparison result;
performing a training operation on the artificial neural network model in response to the comparison result; and
updating weight parameters stored in the buffer memory after performing the training operation.

16. The operating method of claim 15, wherein the training operation is performed in response to the chip-level information, the physical information and operation information.

17. The operating method of claim 10, wherein the optimum parameter is at least one of a program voltage value, a read voltage value, a pulse width of a program voltage, a program loop control, a number of pulses and a voltage rise interval of an incremental step pulse program (ISPP), an erase voltage value, a pulse width of an erase voltage, an erase loop control, and a number of pulses and a voltage rise interval of an incremental step pulse erase (ISPE).

18. The operating method of claim 10, further comprising:
performing a training operation on the artificial neural network model based on the chip-level information and the physical information; and
storing updated weight parameters in the buffer memory following the performing of the training operation.

19. A memory system comprising:
a host device configured to communicate a command; and
a nonvolatile memory device comprising
a memory cell array including a meta data region storing chip-level information,
control logic configured to receive the command and identify a target cell in response to the command,
machine learning (ML) logic configured to infer an optimum parameter based on the chip-level information and physical information associated with the target cell applied as inputs to an artificial neural network model; and
a buffer memory configured to store weight parameters of the artificial neural network model,
wherein the ML logic is further configured to perform a training operation on the artificial neural network model, and
the chip-level information includes location information of the nonvolatile memory device on a wafer.

* * * * *